United States Patent
Huang et al.

(10) Patent No.: US 9,825,606 B2
(45) Date of Patent: Nov. 21, 2017

(54) WIRELESS COMMUNICATION DEVICE AND FILTER THEREOF

(71) Applicant: Wistron NeWeb Corp., Hsinchu (TW)

(72) Inventors: Ching-Feng Huang, Hsinchu (TW); Meng-Luen Lee, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 179 days.

(21) Appl. No.: 15/012,833

(22) Filed: Feb. 1, 2016

(65) Prior Publication Data

US 2016/0294351 A1 Oct. 6, 2016

(30) Foreign Application Priority Data

Apr. 2, 2015 (TW) .................................. 104110900

(51) Int. Cl.
*H01Q 1/50* (2006.01)
*H03H 11/04* (2006.01)
*H03H 7/075* (2006.01)
*H03H 7/01* (2006.01)

(52) U.S. Cl.
CPC .............. *H03H 7/075* (2013.01); *H01Q 1/50* (2013.01); *H03H 7/0115* (2013.01); *H03H 7/1758* (2013.01); *H03H 7/1775* (2013.01); *H03H 11/04* (2013.01)

(58) Field of Classification Search
CPC ........ H01Q 1/50; H03H 7/075; H03H 7/0115; H03H 7/1758

USPC .......................................................... 343/850
See application file for complete search history.

(56) References Cited

U.S. PATENT DOCUMENTS

| 4,410,864 | A | * | 10/1983 | Muterspaugh | ......... H03H 11/04 330/306 |
| 4,571,560 | A | * | 2/1986 | Dobrovolny | ............. H03H 7/00 333/174 |
| 6,982,614 | B2 | * | 1/2006 | Humphrey | .............. H03J 5/244 333/174 |
| 2008/0287089 | A1 | * | 11/2008 | Alles | .................... H03H 7/0153 455/339 |
| 2014/0232481 | A1 | * | 8/2014 | Mizoguchi | ........... H03H 7/0138 333/132 |

* cited by examiner

*Primary Examiner* — Huedung Mancuso
(74) *Attorney, Agent, or Firm* — JCIPRNET

(57) ABSTRACT

A wireless communication device and a filter are provided. The filter has an input end and an output end and includes a first energy storage element, a first series resonant circuit, a second series resonant circuit, a first parallel resonant circuit and a second parallel resonant circuit. The first and the second series resonant circuits respectively have a first capacitor and a first inductor connected in series. The first and the second parallel resonant circuits respectively have a second capacitor and a second inductor connected in parallel. The first series resonant circuit and the first parallel resonant circuit are electrically connected in cascade between a first end of the first energy storage element and a ground, and the second series resonant circuit and the second parallel resonant circuit are electrically connected in cascade between a second end of the first energy storage element and the ground.

20 Claims, 11 Drawing Sheets

WIRELESS COMMUNICATION DEVICE AND FILTER THEREOF

CROSS-REFERENCE TO RELATED APPLICATION

This application claims the priority benefit of Taiwan application serial no. 104110900, filed on Apr. 2, 2015. The entirety of the above-mentioned patent application is hereby incorporated by reference herein and made a part of this specification.

BACKGROUND OF THE INVENTION

Field of the Invention

The invention is related to a wireless communication device and a filter thereof, and more particularly to a wireless communication device with concurrent dual-radio operation and a filter thereof.

Description of Related Art

For the past few years, wireless local area network that meets IEEE 802.11 ac communication standard utilizes concurrent dual-radio technology to increase the number of user connections. The IEEE 802.11ac communication standard may use the band of unlicensed national information infrastructure (UNII) to perform communication. With concurrent dual-radio operation, two transceivers in a wireless communication device may simultaneously operate in an UNII-1(5.17~5.25 GHz) band and an UNII-3(5.735~5.815 GHz) band adjacent to each other. In addition, to prevent the wireless communication device from being affected by the interference between two bands, it is necessary to equip the wireless communication device with a filter having a steep filtering curve and high isolation.

Generally speaking, a thin-film bulk acoustic resonator (FBAR) and a dielectric resonator filter (DRF) are often used to be designed as a filter having a steep filtering curve or high isolation. However, the above filter has to be manufactured through a special process; therefore, the manufacturing cost is high and the filter is formed to have a large area. Additionally, conventional technologies increase order of the filter to increase the attenuation thereof. However, as the order of the filter increases, the size of the filter increases as well, causing the filter to have larger insertion loss and worse amplitude flatness. In other words, conventional filters normally increase the manufacturing cost of the wireless communication device and limit minimization of the wireless communication device.

SUMMARY OF THE INVENTION

The invention provides a wireless communication device and a filter thereof. Two ends of an energy storage element are respectively connected in cascade with a series resonant circuit and a parallel resonant circuit so as to form a filter. Accordingly, the filter can effectively reduce the manufacturing cost of the wireless communication device and facilitate minimization of the wireless communication device.

In the invention, the filter has an input end and an output end and includes a first energy storage element, a first series resonant circuit, a second series resonant circuit, a first parallel resonant circuit and a second parallel resonant circuit. The first and the second series resonant circuits respectively include a first capacitor and a first inductor connected in series. The first and the second parallel resonant circuits respectively include a second capacitor and a second inductor connected in parallel. In addition, the first series resonant circuit and the first parallel resonant circuit are connected in cascade between a first end of the first energy storage element and a ground, and the second series resonant circuit and the second parallel resonant circuit are connected in cascade between a second end of the first energy storage element and the ground.

In the invention, the wireless communication device includes a first transceiver, a second transceiver, a first filter and a second filter. The first transceiver is electrically connected to a first antenna through at least one first signal end. The second transceiver is electrically connected to a second antenna through at least one second signal end. The first filter includes a first pass band and a first stop band and disposed between the at least one first signal end and the first antenna. The second filter includes a second pass band and a second stop band and disposed between the at least one second signal end and the second antenna. The first pass band is identical with the second stop band, and the first stop band is identical with the second pass band. The first filter and the second filter respectively have an input end and an output end, and respectively include a first energy storage element, a first series resonant circuit, a second series resonant circuit, a first parallel resonant circuit and a second parallel resonant circuit. The first and the second series resonant circuits respectively include a first capacitor and a first inductor that are connected in series. The first and the second parallel resonant circuits respectively include a second capacitor and a second inductor that are connected in parallel. The first series resonant circuit and the first parallel resonant circuit are connected in cascade between a first end of the first energy storage element and the ground. The second series resonant circuit and the second parallel resonant circuit are connected in cascade between a second end of the first energy storage element and the ground.

Based on the above, in the invention, the first end of the first energy storage element is connected in cascade with the first series resonant circuit and the first parallel resonant circuit, and the second end of the first energy storage element is connected in cascade with the second series resonant circuit and the second parallel resonant circuit so as to form the filter. Accordingly, the filter can effectively reduce the manufacturing cost of the wireless communication device and facilitate minimization of the wireless communication device.

In order to make the aforementioned features and advantages of the invention more comprehensible, embodiments accompanying figures are described in detail below.

DESCRIPTION OF EMBODIMENTS

Figure 1:
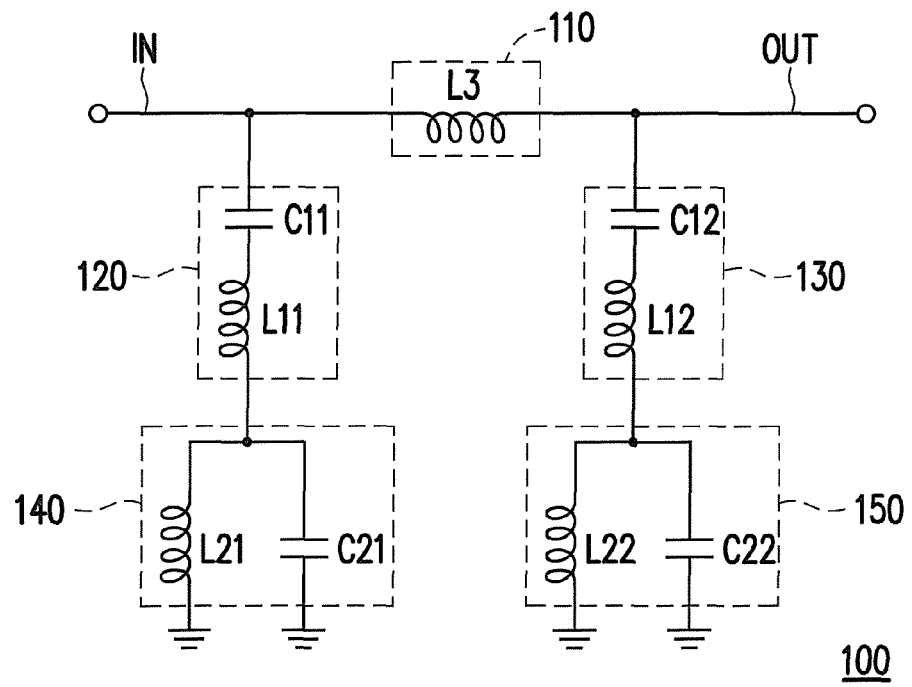
FIG. 1 is a schematic view illustrating a circuit of a filter according to an embodiment of the invention.

FIG. 1 is a schematic view illustrating a circuit of a filter according to an embodiment of the invention. As shown in FIG. 1, a filter 100 has an input end IN and an output end OUT. The filter 100 includes an energy storage element 110, series resonant circuits 120 and 130, and parallel resonant circuits 140 and 150. The energy storage element 110 is electrically connected between the input end IN and the output end OUT. The series resonant circuits 120 and 130 respectively include a capacitor and an inductor that are connected in series. For example, the series resonant circuit 120 includes a capacitor C11 and an inductor L11 that are connected in series. The series resonant circuit 130 includes a capacitor C12 and an inductor L12 that are connected in series.

The parallel resonant circuits 140 and 150 respectively include a capacitor and an inductor connected in parallel. For example, the parallel resonant circuit 140 includes a capacitor C21 and an inductor L21 that are connected in parallel. Moreover, the parallel resonant circuit 150 includes a capacitor C22 and an inductor L22 that are connected in parallel. Specifically, the series resonant circuit 120 and the parallel resonant circuit 140 are connected in cascade between a first end of the energy storage element 110 and the ground. The series resonant circuit 130 and the parallel resonant circuit 150 are connected in cascade between a second end of the energy storage element 110 and the ground. Accordingly, the filter 100 having a pass band and a stop band can be formed.

For example, in the embodiment illustrated by FIG. 1, the energy storage element 110 may be, for example, an inductor L3. In addition, a first end of the inductor L3 is electrically connected to the input end IN and the capacitor C11 of the series resonant circuit 120. Moreover, the second end of the inductor L3 is electrically connected to the output end OUT and the capacitor C12 of the series resonant circuit 130. The inductor L11 of the series resonant circuit 120 is electrically connected to the capacitor C21 and the inductor L21 of the parallel resonant circuit 140. The inductor L12 of the series resonant circuit 130 is electrically connected to the capacitor C22 and the inductor L22 of the parallel resonant circuit 150. Accordingly, the energy storage element 110, the series resonant circuits 120 and 130 as well as the parallel resonant circuits 140 and 150 may form a 5-order low-pass filter.

Figure 2:
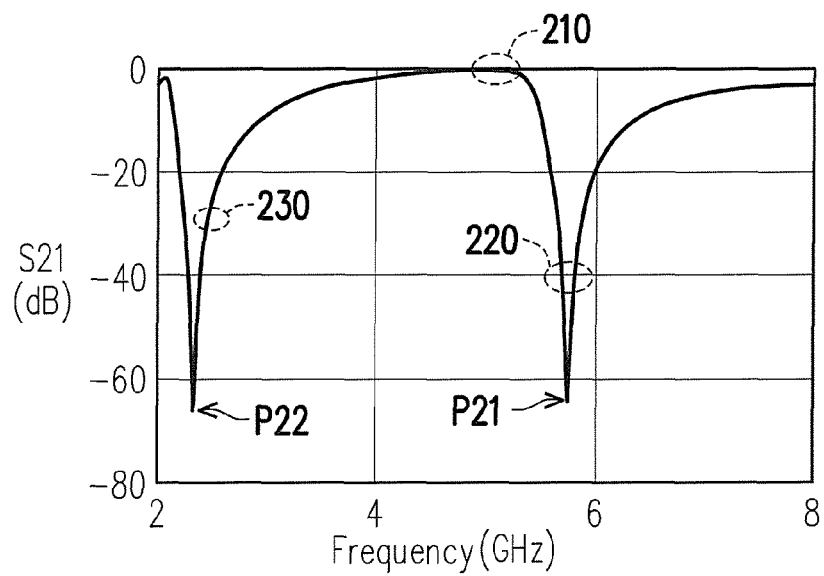
FIG. 2 is a schematic view describing frequency response of the filter in FIG.

FIG. 2 is a schematic view describing frequency response of the filter in FIG. 1. As shown in FIG. 2, the characteristic curve of the filter 100 includes a pass band 210 and a stop band 220. The frequency of the pass band 210 covers 5.17~5.25 GHz (i.e. UNII-1 band). The frequency of the stop band 220 covers 5.735~5.815 GHz (i.e. UNII-3 band). In addition, the insertion loss of the filter 100 in the pass band 210 is about 0.7 dB. Moreover, the lowest attenuation of the filter 100 in the stop band 220 may be −39 dB. In other words, the pass band 210 of the filter 100 is very flat, and the filter 100 has rapid attenuation in a transition band.

Therefore, compared with conventional filters, the filter 100 may be formed with good performance without increasing the order of the filter 100, thereby reducing the manufacturing cost of the wireless communication device and facilitating minimization of the wireless communication device. Besides, the characteristic curve of the filter 100 includes two turning points P21 and P22. Accordingly, the filter 100 not only can attenuate the signal in the stop band 220, but also can attenuate the signal in a filter band 230 (i.e. 2.412~2.484 GHz). For example, the lowest attenuation of the filter 100 in the filter band 230 may be −27 dB.

It should be noted that, in the embodiment illustrated by FIG. 1, the capacitance of the capacitor C11 is equal to the capacitance of the capacitor C12. Meanwhile, the capacitance of the capacitor C21 is equal to the capacitance of the capacitor C22. In addition, the capacitance of the capacitor C11 is greater than the capacitance of the capacitor C21. The inductance of the inductor L11 is equal to the inductance of the inductor L12. The inductance of the inductor L21 is equal to the inductance of the inductor L22. Furthermore, the inductance of the inductor L3 is greater than the inductance of the inductor L11. Also, the inductance of the inductor L21 is greater than the inductance of the inductor L3. Additionally, persons of ordinary skill in the art may adjust the capacitance of the above capacitors and the inductance of the above inductors depending on the needs of design.

Although the embodiment described by FIG. 1 exemplifies types of the filter, it should not be construed as a limitation to the invention. Persons having ordinary skill in the art may adjust the component for forming the energy storage element 110 as well as the connecting sequence of the capacitor and the inductor of the series resonant circuits 120 and 130 so as to form a high-pass filter through the energy storage element, two series resonant circuits and two parallel resonant circuits.

Figure 3:
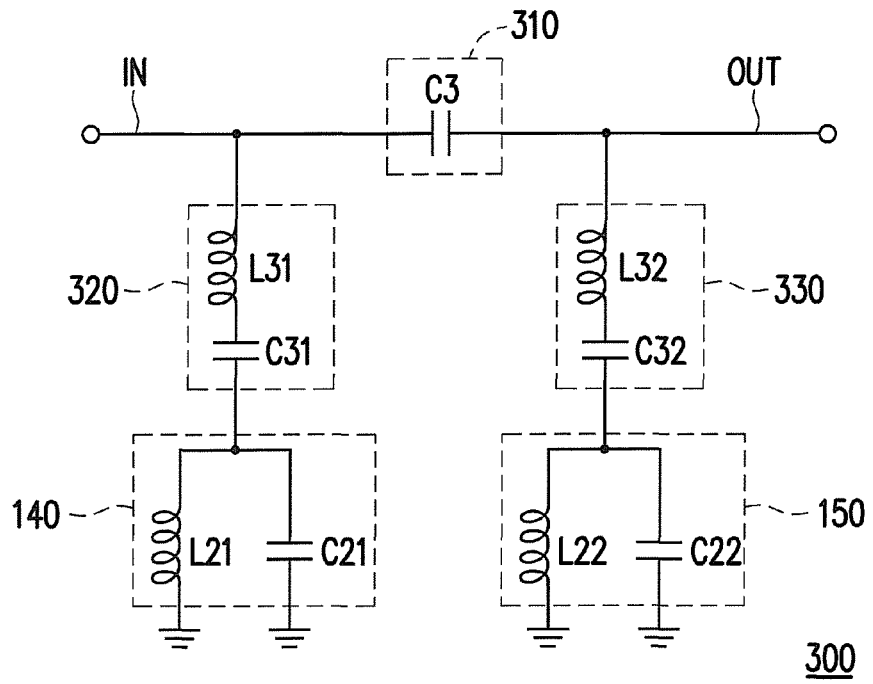
FIG. 3 is a schematic view illustrating a circuit of a filter according to another embodiment of the invention.

For example, FIG. 3 is a schematic view illustrating a circuit of a filter according to another embodiment of the invention. In the embodiment described by FIG. 3, an energy storage element 310 may be, for example, a capacitor C3. In addition, a first end of the capacitor C3 is electrically connected to the input end IN and an inductor L31 of a series resonant circuit 320. A second end of the capacitor C3 is electrically connected to the output end OUT and an inductor L32 of a series resonant circuit 330. The capacitor C31 of the series resonant circuit 320 is electrically connected to the capacitor C21 and the inductor L21 of the parallel resonant circuit 140. The capacitor C32 of the series resonant circuit 330 is electrically connected to the capacitor C22 and the inductor L22 of the parallel resonant circuit 150. The capacitance of the capacitors C31, C32, C21 and C22 are identical. The capacitance of the capacitor C3 is less than the capacitance of the capacitor C31. The inductance of the inductor L31 is equal to the inductance of the inductor L32. The inductance of the inductor L31 is less than the inductance of the inductor L21. Accordingly, the energy storage element 310, the series resonant circuits 320 and 330 as well as the parallel resonant circuits 140 and 150 may form a 5-order high-pass filter.

Figure 4:
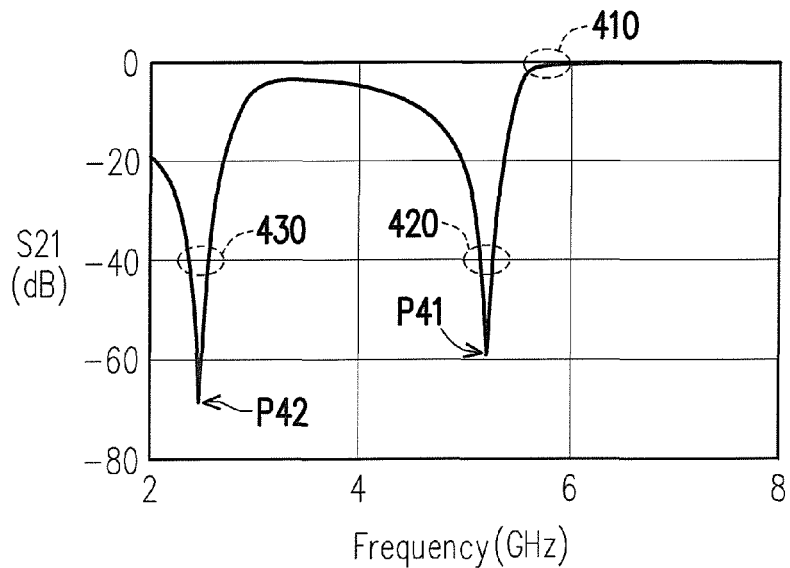
FIG. 4 is a schematic view describing frequency response of the filter in FIG. 3.

FIG. 4 is a schematic view describing frequency response of the filter in FIG. 3. As shown by FIG. 4, the characteristic curve of a filter 300 includes a pass band 410 and a stop band 420. The frequency of the pass band 410 covers 5.735~5.815 GHz (i.e. UNII-3 band), and the frequency of the stop band 420 covers 5.17~5.25 GHz (i.e. UNII-1 band). Moreover, the insertion loss of the filter 300 in the pass band 410 is about 0.9 dB, and the lowest attenuation of the filter 300 in the stop band 420 may be −41 dB. Furthermore, the characteristic curve of the filter 300 includes two turning points P41 and P42. Therefore, the filter 300 not only can attenuate the signal in the stop band 420, but also can attenuate the signal in a filter band 430 (i.e. 2.412~2.484 GHz). For example, the lowest attenuation of the filter 300 in the filter band 430 may be −47 dB.

It should be noted that the capacitors C11, C12, C21, C22, C3, C31 and C32 as well as the inductors L11, L12, L21, L22, L3, L31 and L32 of the filters 100 and 300 respectively may be a chip-type element. That is, the capacitors C11, C12, C21, C22, C3, C31 and C32 of the filters 100 and 300 respectively may be constituted by a chip capacitor. Moreover, the inductors L11, L12, L21, L22, L3, L31 and L32 of the filters 100 and 300 respectively may be constituted by a chip inductor. In other words, the filters 100 and 300 respectively may be formed of the chip inductor and the chip capacitor, thereby effectively reducing the size and price of the filters 100 and 300 and facilitating minimization of the wireless communication device as well as reducing the manufacturing cost of the wireless communication device.

Figure 5:
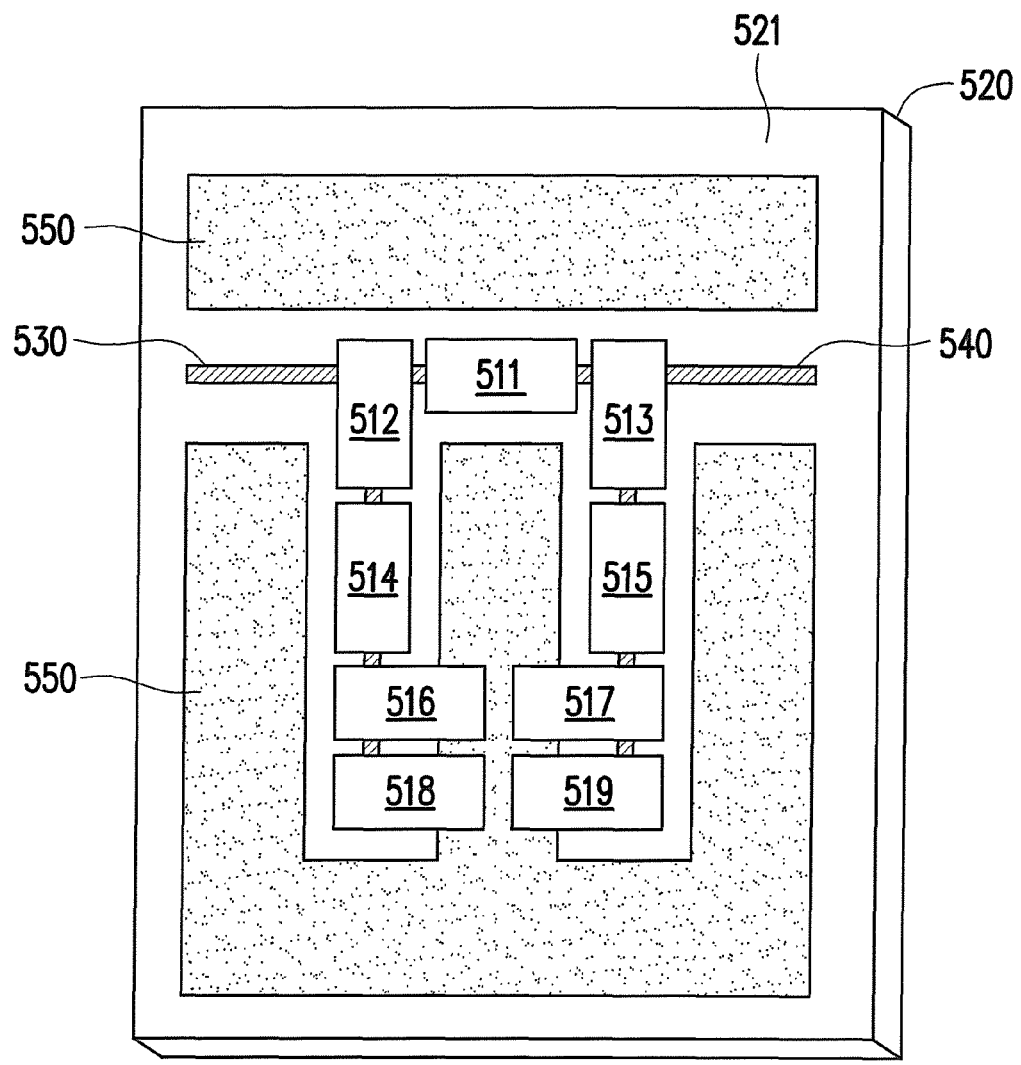
FIG. 5 is a schematic view illustrating a layout of a filter according to an embodiment of the invention.

For example, FIG. 5 is a schematic view illustrating a layout of a filter according to an embodiment of the invention. As shown by FIG. 5, chip-type elements 511-519 are disposed on a surface 521 of a substrate 520. In the meantime, the chip-type elements 511-519 respectively may be a chip inductor or a chip capacitor. For instance, the chip-type elements 511 and 514-517 respectively may be a chip inductor, and the chip-type elements 512, 513, 518 and 519 respectively may be a chip capacitor, such that the chip-type elements 511-519 may form a low-pass filter as shown by FIG. 1. Apart from that, conductive lines 530 and 540 respectively are used for constituting the input end and output end of the filter. Furthermore, a conductive surface 550 is used as the ground of the filter.

Figure 6:
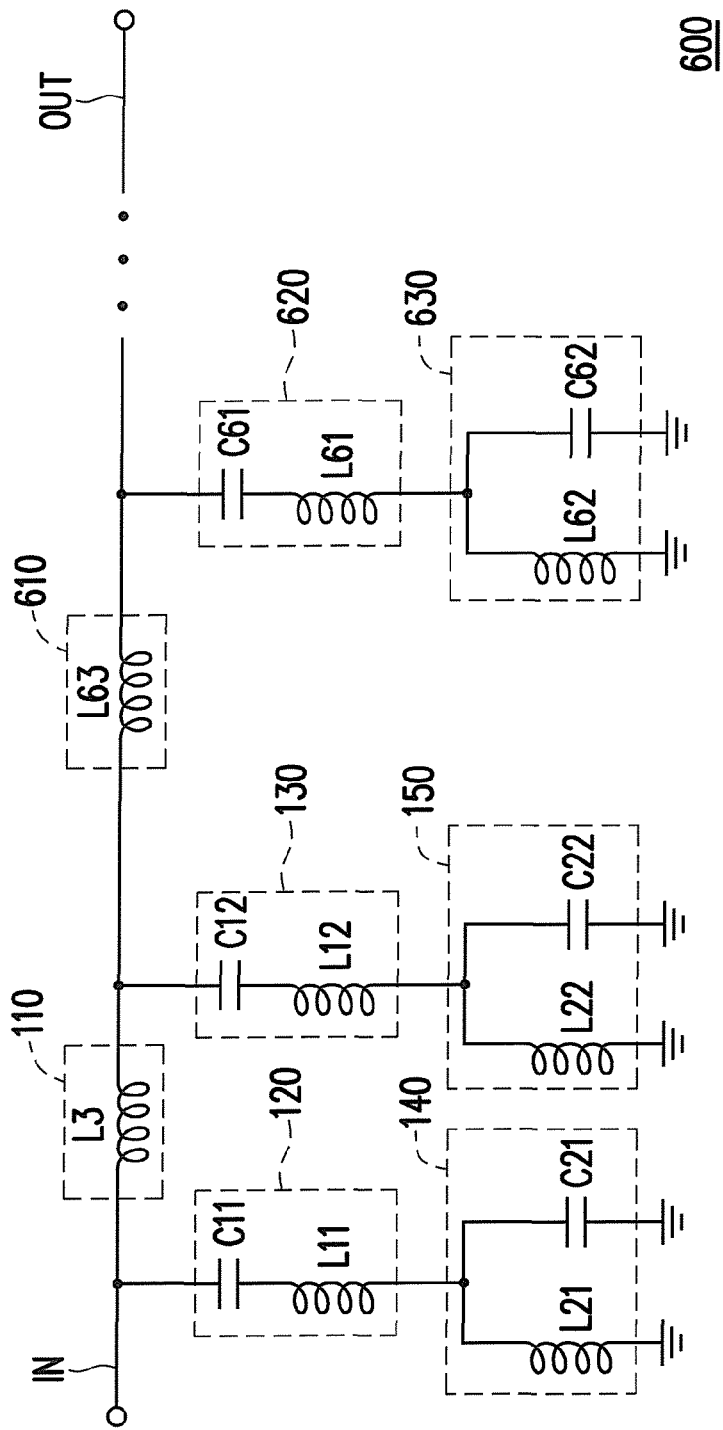
FIG. 6 is a schematic view illustrating a circuit of a filter according to another embodiment of the invention.

The embodiments described by FIGS. 1 and 3 exemplify the 5-order filters 100 and 300. However, in another embodiment, persons of ordinary skill in the art may increase the order of the filters 100 and 300 to 8, 11, 14, 17 etc. orders depending on the needs of design. For example, FIG. 6 is a schematic view illustrating a circuit of a filter according to another embodiment of the invention. Compared with the embodiment described by FIG. 1, a filter 600 in FIG. 6 further includes an energy storage element 610, a series resonant circuit 620 and a parallel resonant circuit 630. A first end of the energy storage element 610 is electrically connected to the energy storage element 110, and a second end of the energy storage element 610 is electrically connected to the output end OUT. The energy storage element 610 may be, for example, an inductor L63.

Like the series resonant circuit 120, the series resonant circuit 620 includes a capacitor C61 and an inductor L61. The capacitor C61 and the inductor L61 are connected in series between the second end of the inductor L63 and the parallel resonant circuit 630. Like the series resonant circuit 140, the parallel resonant circuit 630 includes an inductor L62 and a capacitor C62. The inductor L62 and the capacitor C62 are connected in parallel between the inductor L61 and the ground. The series resonant circuit 620 and the parallel resonant circuit 630 are connected in cascade between the second end of the energy storage element 610 and the ground. Accordingly, the energy storage element 610, the series resonant circuit 620 and the parallel resonant circuit 630 may cause the order of the filter 600 to be expanded to 8 orders. In other words, the filter 600 in FIG. 6 may be, for example, an 8-order low-pass filter. It should be noted that, in another embodiment, the energy storage element 610 may also be, for example, electrically connected between the input end IN and the energy storage element 110. That is to say, in another embodiment, the first end of the energy storage element 610 is electrically connected to the energy storage element 110, and the second end of the energy storage 610 is electrically connected to the input end IN.

Figure 7:
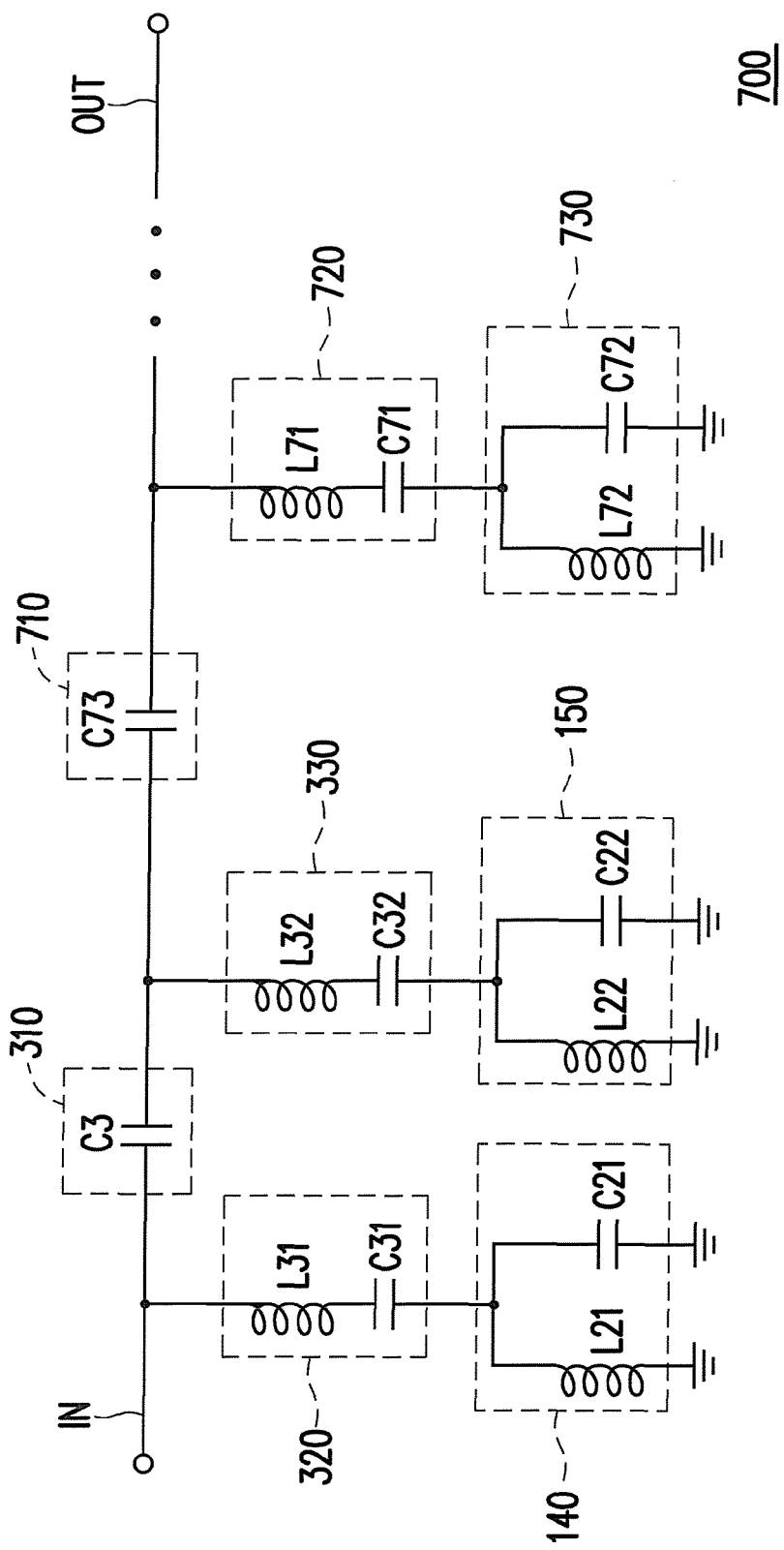
FIG. 7 is a schematic view illustrating a circuit of a filter according to another embodiment of the invention.

FIG. 7 is a schematic view illustrating a circuit of a filter according to another embodiment of the invention. Compared with the embodiment described by FIG. 3, a filter 700 in FIG. 7 further includes an energy storage element 710, a series resonant circuit 720 and a parallel resonant circuit 730. The energy storage element 710 is disposed between the energy storage element 310 and the output end OUT, and the energy storage element 710 may be, for example, a capacitor C73. The circuit structures of the series resonant circuit 720 and the series resonant circuit 320 are identical, and the circuit structures of the parallel resonant circuit 730 and the parallel resonant circuit 140 are identical. For instance, the series resonant circuit 720 includes an inductor L71 and a capacitor C71 that are connected in series. The parallel resonant circuit 730 includes an inductor L72 and a capacitor C72 that are connected in parallel. Moreover, the series resonant circuit 720 and the parallel resonant circuit 730 are connected in cascade between a second end of the energy storage element 710 and the ground. Accordingly, the filter 700 in FIG. 7 may be, for example, an 8-order high-pass filter. In another embodiment, the energy storage element 710 may also be, for example, electrically connected between the input end IN and the energy storage element 310.

Figure 8:
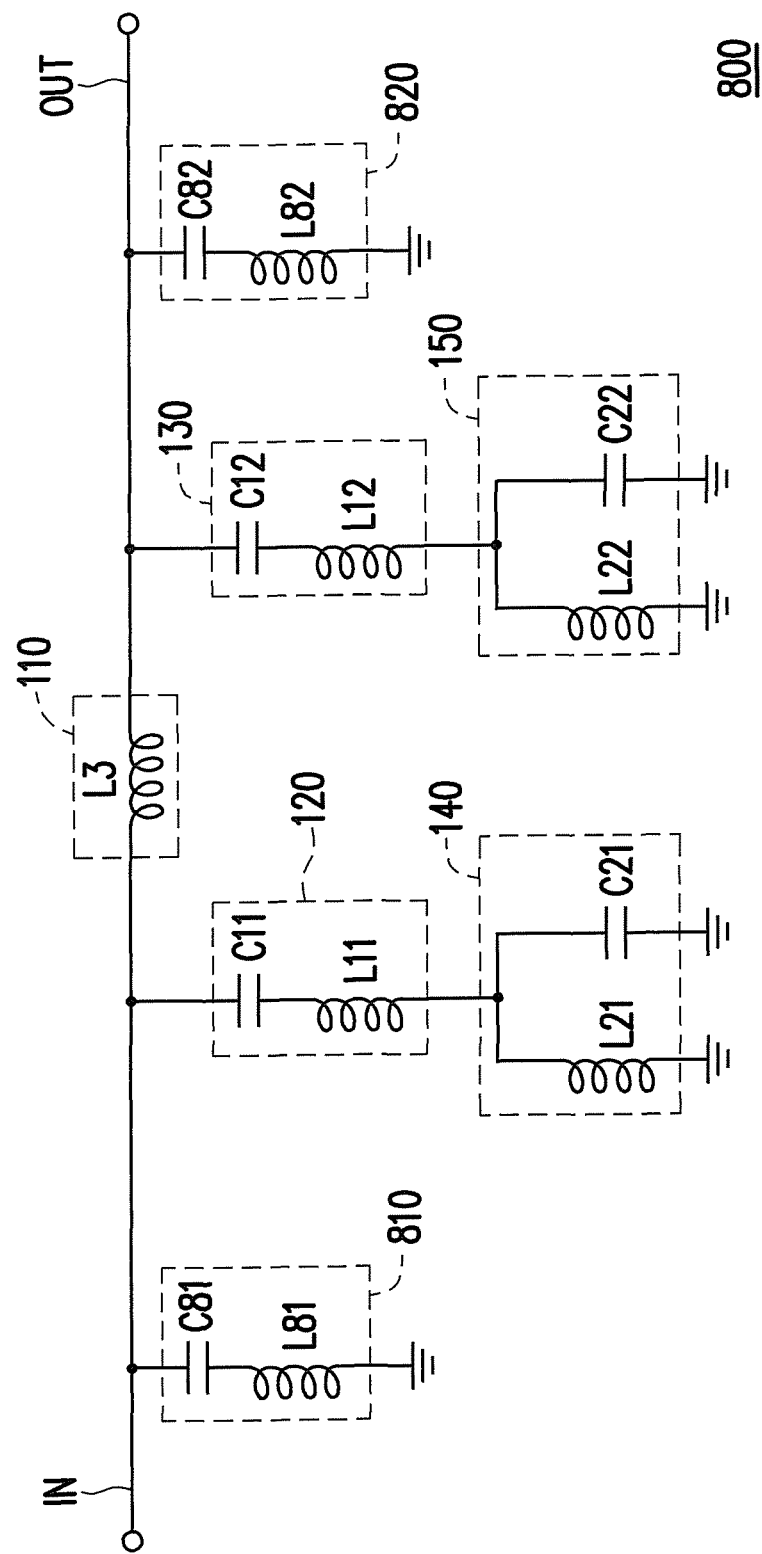
FIG. 8 is a schematic view illustrating a circuit of a filter according to another embodiment of the invention.

It should be noted that persons of ordinary skill in the art may increase another filter band to filter second order harmonic distortion by adding a series resonant circuit in both ends of the filter depending the needs of the design. For example, FIG. 8 is a schematic view illustrating a circuit of a filter according to another embodiment of the invention. Compared with the embodiment described by FIG. 1, a filter 800 further includes series resonant circuits 810 and 820, wherein the series resonant circuit 810 is electrically connected to the input end IN, and the series resonant circuit 820 is electrically connected to the output end OUT.

The series resonant circuits 810 and 820 respectively include a capacitor and an inductor that are connected in series, and the sequence of serial connection of the capacitor and the inductor may be switched to be any sequence. For example, the series resonant circuit 810 includes a capacitor C81 and an inductor L81, and the series resonant circuit 820 includes a capacitor C82 and an inductor L82. The capacitor C81 and the inductor L81 are sequentially connected in series between the input end IN and the ground. The sequence of serial connection of the capacitor C81 and the inductor L81 may be switched to be any sequence. Likewise, the capacitor C82 and the inductor L82 are sequentially connected in series between the output end OUT and the ground. The sequence of serial connection of the capacitor C82 and the inductor L82 may be switched to be any sequence. Accordingly, the filter 800 may increase another filter band through the series resonant circuits 810 and 820.

Figure 9:
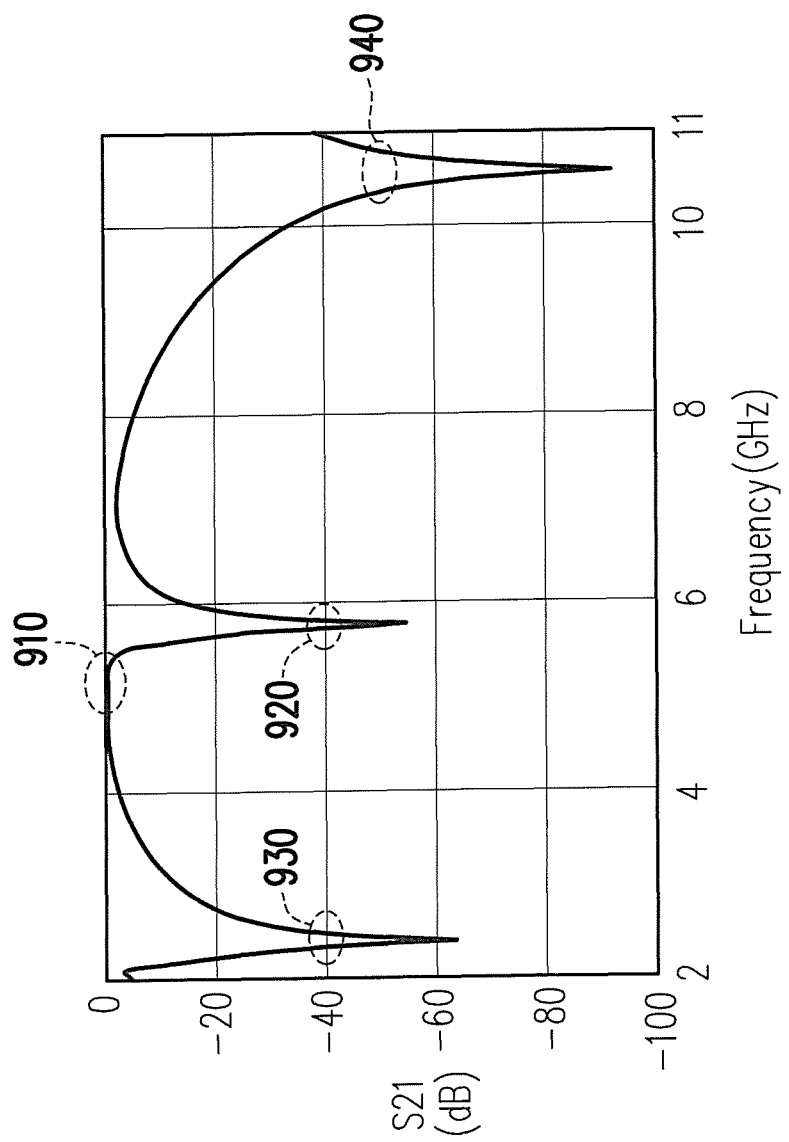
FIG. 9 is a schematic view describing frequency response of the filter in FIG. 8.

For example, FIG. 9 is a schematic view describing frequency response of the filter in FIG. 8. As shown by FIG. 9, the filter 800 may generate a pass band 910, a stop band 920 and a filter band 930 through the energy storage element 110, the series resonant circuits 120 and 130 as well as the parallel resonant circuits 140 and 150. The filter 800 may further generate another filter band 940 through the series resonant circuits 810 and 820 to filter the second order harmonic distortion. The center frequency f1 of the filter band 940 may be indicated by formula (1) as $$f1 = \frac{1}{2\pi\sqrt{L1 \times C1}},$$

wherein L1 represents the inductance of the inductors L81 and L82. C1 represents the capacitance of the capacitors C81 and C82. Moreover, the pass band 910 of the filter 800 may, for example, cover 5.17~5.25 GHz (i.e. UNII-1 band), and the frequency of the 2-order harmonic is equal to (5.17+5.25)=10.42 GHz. To suppress the second order harmonic distortion, the center frequency f1 of the filter band 940 may be set as 10.42 GHz. The above formula (1) may be used to calculate the inductance of the inductors L81 and L82 as well as the capacitance of the capacitors C81 and C82.

Figure 10:
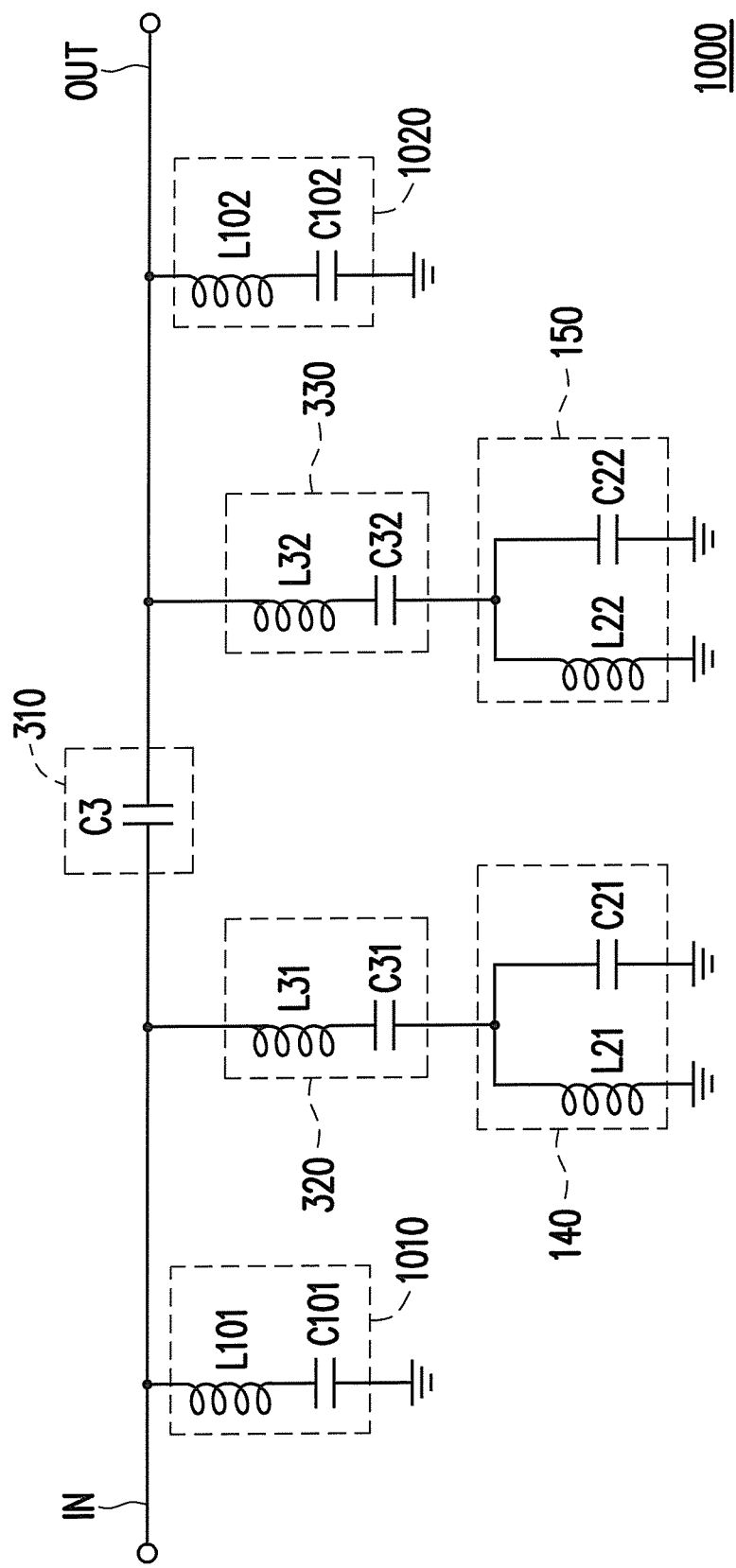
FIG. 10 is a schematic view illustrating a circuit of a filter according to another embodiment of the invention.
Figure 11:
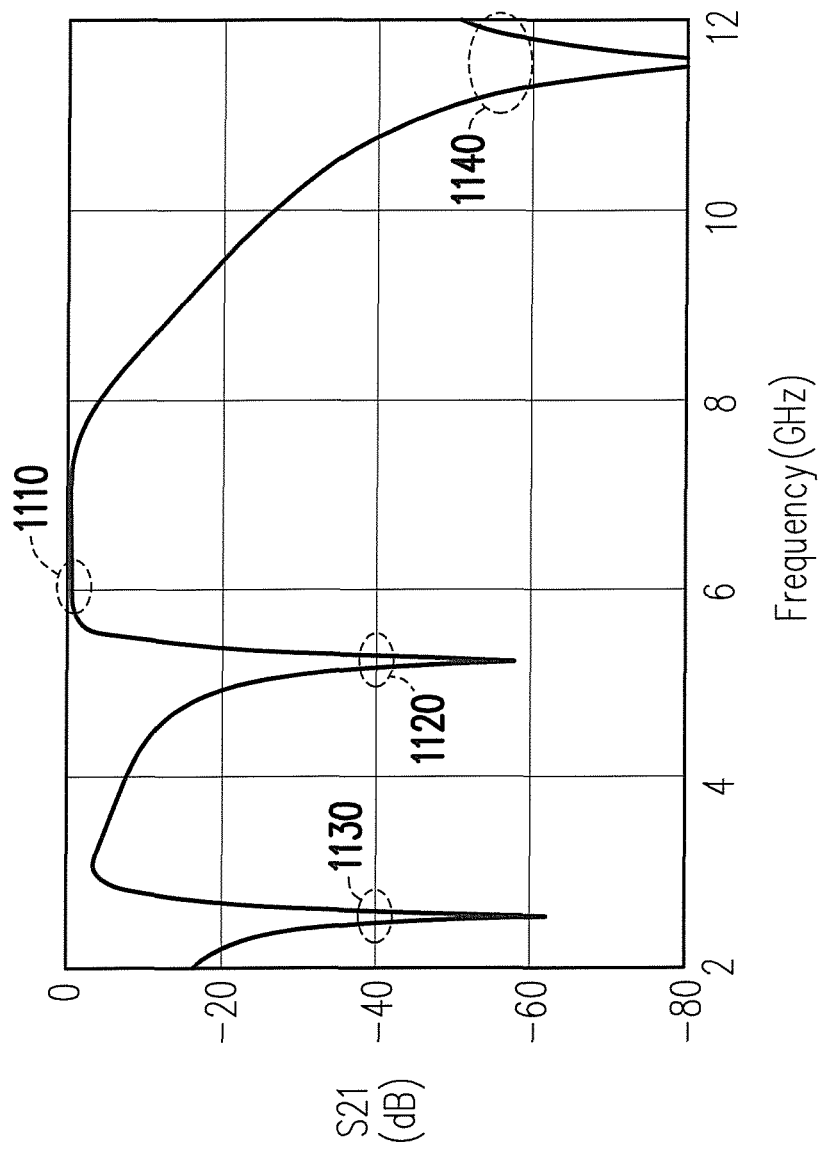
FIG. 11 is a schematic view illustrating frequency response of the filter in FIG. 10.

Likewise, FIG. 10 is a schematic view illustrating a circuit of a filter according to another embodiment of the invention. FIG. 11 is a schematic view illustrating frequency response of the filter in FIG. 10. Compared with the embodiment described by FIG. 3, a filter 1000 further includes series resonant circuits 1010 and 1020, wherein the series resonant circuit 1010 is electrically connected to the input end IN, and the series resonant circuit 1020 is electrically connected to the output end OUT. The series resonant circuit 1010 includes an inductor L101 and a capacitor C101 that are connected in series. The sequence of serial connection of the inductor L101 and the capacitor C101 may be switched. Likewise, the series resonant circuit 1020 includes a capacitor C102 and an inductor L102 that are connected in series. The sequence of serial connection of the capacitor C102 and the inductor L102 may be switched. Accordingly, the filter 1000 may increase another filter band through the series resonant circuits 1010 and 1020.

For example, as shown by FIG. 11, the filter 1000 may generate a pass band 1110, a stop band 1120 and a filter band 1130 through the energy storage element 310, the series resonant circuits 320 and 330 as well as the parallel resonant circuits 140 and 150. Moreover, the filter 1000 may further generate another filter band 1140 through the series resonant circuits 1010 and 1020 so as to filter the second order harmonic distortion. For example, a center frequency f2 of the filter band 1140 may be indicated through formula (2) as $$f2 = \frac{1}{2\pi\sqrt{L2 \times C2}},$$

wherein L2 represents the inductance of the inductors L101 and L102, and C2 represents the capacitance of the capacitors C101 and 102. Additionally, the pass band 1110 of the filter 1000 may, for example, cover 5.735~5.815 GHz (i.e. UNII-3 band), and the frequency of the second order harmonic distortion is equal to (5.735+5.815)=11.55 GHz. To suppress the second order harmonic distortion, the center frequency f2 of the filter band 1140 may be set as 11.55 GHz. The above formula (2) may be used to calculate the inductance of the inductors L101 and L102 as well as the capacitance of the capacitors C101 and C102.

Compared with conventional filters, the filters 100, 300, 600, 700, 800 and 1000 as exemplified in the above embodiments have better frequency response, and the attenuation slope is steeper as well. Accordingly, the filters exemplified in the above embodiments have the characteristic of steep filter curve or high isolation, which may be applied in the wireless communication device having concurrent dual-radio operation so as to solve mutual interference between two adjacent bands in the wireless communication device.

Figure 12:
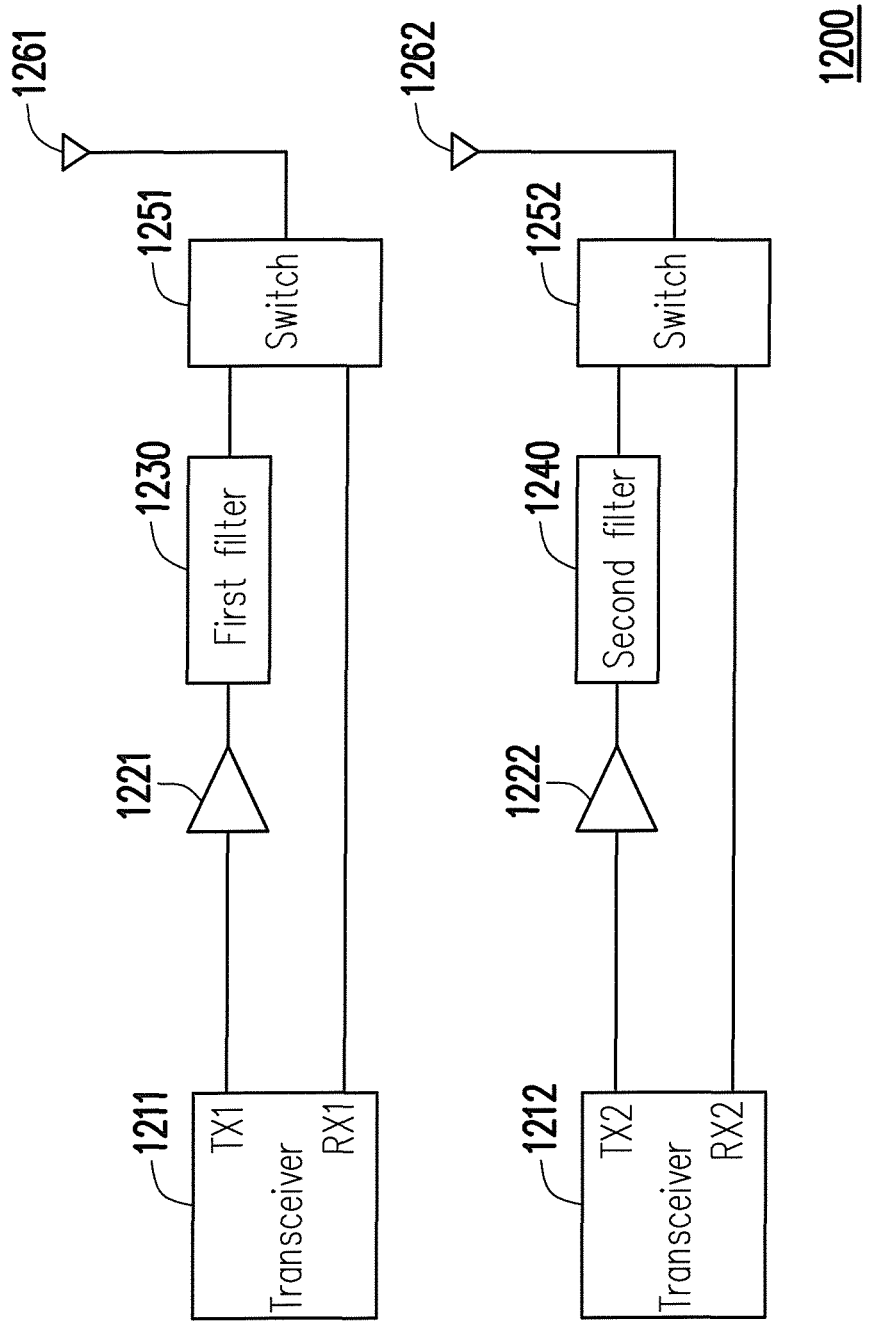
FIG. 12 is a schematic block view illustrating a wireless communication device according to an embodiment of the invention.

For example, FIG. 12 is a schematic block view illustrating a wireless communication device according to an embodiment of the invention. As shown by FIG. 12, a wireless communication device 1200 includes transceivers 1211 and 1212, power amplifiers 1221 and 1222, a first filter 1230, a second filter 1240, switches 1251 and 1252 as well as antennas 1261 and 1262, wherein the transceivers 1211 and 1212 respectively include at least one signal end. For instance, signal ends of the transceiver 1211 includes a transmitting end TX1 and a receiving end RX1, and the transceiver 1211 may be electrically connected to the antenna 1261 through the transmitting end TX1 or the receiving end RX1. Likewise, signal ends of the transceiver 1212 includes an transmitting end TX2 and a receiving end RX2, and the transceiver 1212 may be electrically connected to the antenna 1262 through the transmitting end TX2 or the receiving end RX2. In another embodiment, the transceivers 1211 and 1212 respectively may include a plurality of transmitting ends and a plurality of receiving ends, and may be equipped with a plurality of switches for the plurality of transmitting ends and receiving ends to be connected to a plurality of antennas, such that the transceivers 1211 and 1212 have a multiple-input multiple-output (MIMO) transmission mechanism to increase data transmission speed.

In terms of the transceiver 1211, the switch 1251 has a first to a third ends. The first end of the switch 1251 is electrically connected to the antenna 1261, and the second end of the switch 1251 is electrically connected to the receiving end RX1. The power amplifier 1221 and the first filter 1230 are connected in series between the transmitting end TX1 and the third end of the switch 1251. The transceiver 1211 may use a control signal to control the switch 1251 such that the first end of the switch 1251 is conducted to the second end or the third end of the switch 1251. In other words, the switch 1251 may conduct the antenna 1261 to the first filter 1230 or the receiving end RX1 such that the wireless communication device 1200 may transmit or receive a radio frequency signal through the antenna 1261. For example, when the switch 1251 conducts the antenna 1261 to the first filter 1230, the power amplifier 1221 may amplify a signal from the transmitting end TX1 so as to generate an output signal. The first filter 1230 filters an output signal of the power amplifier 1221 such that the wireless communication device 1200 may transmit a radio frequency signal in the pass band of the first filter 1230.

In terms of the transceiver 1212, the switch 1252 has a first to a third ends. The first end of the switch 1252 is electrically connected to the antenna 1262, and the second end of the switch 1252 is electrically connected to the receiving end RX2. The power amplifier 1222 and the second filter 1240 are connected in series between the transmitting end TX2 and the third end of the switch 1252. The transceiver 1212 may use a control signal to control the switch 1252 such that the first end of the switch 1252 is conducted to the second end or the third end of the switch 1252. In other words, the switch 1252 may conduct the antenna 1262 to the second filter 1240 or the receiving end RX2 such that the wireless communication device 1200 may transmit or receive the radio frequency signal through the antenna 1262. For example, when the switch 1252 conducts the antenna 1262 to the second filter 1240, the power amplifier 1222 may amplify the signal from the transmitting end TX2 so as to generate an output signal. The second filter 1240 filters an output signal of the power amplifier 1222 such that the wireless communication device 1200 may transmit a radio frequency signal in the pass band of the second filter 1240.

It should be noted that the pass band of the first filter 1230 and the stop band of the second filter 1240 are identical. The stop band of the first filter 1230 and the pass band of the second filter 1240 are identical. For example, the first filter 1230 may be, for example, the low-pass filter 100 as described by FIG. 1, and the second filter 1240 may be, for example, the high-pass filter 300 as described by FIG. 3. At this time, as shown by FIGS. 2 and 4, the first filter 1230 includes the pass band 210 (i.e. UNII-1 band), the stop band 220 (i.e. UNII-3 band) and the filter band 230 (i.e. 2.412~2.484 GHz). The second filter 1240 includes the pass band 410 (i.e. UNII-3 band), the stop band 420 (i.e. UNII-1 band) and the filter band 430 (i.e. 2.412~2.484 GHz).

Accordingly, the wireless communication device 1200 may simultaneously transmit the radio frequency signal in the two pass bands (i.e. UNII-1 band and UNII-3 band) of the first filter 1230 and the second filter 1240 and avoid mutual interference between the two adjacent pass bands (i.e. UNII-1 band and UNII-3 band), such that the wireless communication device 1200 may perform the concurrent dual-radio operation. Moreover, the wireless communication device 1200 may additionally filter the signal in the filter band through the first filter 1230 and the second filter 1240 with the filter band (i.e. 2.412~2.484 GHz), thereby improving the communication quality of the wireless communication device 1200 or reducing interference of other communication devices which are applied in the band of 2.412~2.484 GHz. Furthermore, the first filter 1230 and the second filter 1240 have sufficient attenuation without adding orders. The first filter 1230 and the second filter 1240 may be constituted by the chip inductor and the chip capacitor. Therefore, the first filter 1230 and the second filter 1240 may effectively reduce the manufacturing cost of the wireless communication device 1200 and facilitates minimization of the wireless communication device 1200.

Although the embodiment described by FIG. 12 exemplifies the structure of the wireless communication device 1200, it should not be construed as a limitation to the invention. Persons having ordinary skill in the art may dispose a plurality of filters in the transmitting path and the receiving path of the transceiver depending the needs of the design to further improve the communication quality of the wireless communication device. For example, FIG. 13 is a schematic block view illustrating a wireless communication device according to another embodiment of the invention.

Figure 13:
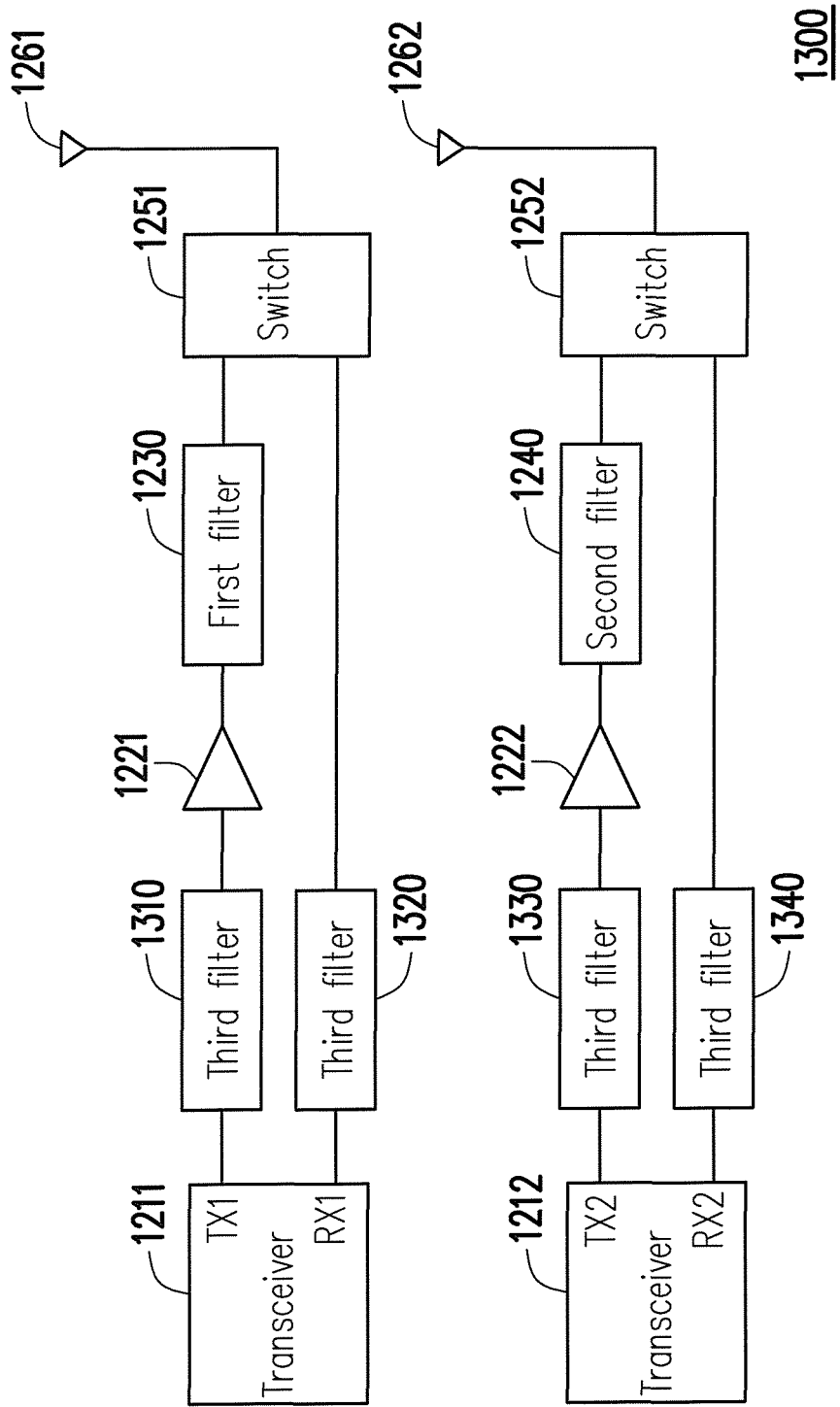
FIG. 13 is a schematic block view illustrating a wireless communication device according to another embodiment of the invention.

Compared with the embodiment described by FIG. 12, a wireless communication device 1300 in FIG. 13 further includes third filters 1310-1340, wherein the circuit structures of the third filters 1310 and 1320 are identical as the circuit structure of the first filter 1230. For instance, the first filter 1230 and the third filters 1310-1320 may be, for example, a low-pass filter as described by FIG. 1, 6 or 8. Moreover, the third filter 1310 is inserted in series between the transmitting end TX1 and the power amplifier 1221. The third filter 1320 is inserted in series between the receiving end RX1 and the second end of the switch 1251. The circuit structures of the third filters 1330 and 1340 are identical as the circuit structure of the second filter 1240. For example, the second filter 1240 and the third filters 1330-1340 may be, for example, a high-pass filter as described by FIG. 3, 7 or 10. In the meantime, the third filter 1330 is inserted in series between the transmitting end TX2 and the power amplifier 1222. The third filter 1340 is inserted in series between the receiving end RX2 and the second end of the switch 1252. Accordingly, the wireless communication device 1300 may simultaneously receive the radio frequency signal in the two pass bands (i.e. UNII-1 band and UNII-3 band) of the third filter 1320 and the third filter 1340. Furthermore, the wireless communication device 1300 may further attenuate more wireless interference (e.g. co-channel interference, adjacent-channel interference) through the third filters 1310-1340 so as to improve the communication quality of the wireless communication device 1300. It should be noted that persons having ordinary skill in the art may choose one of the first filter 1230 and the third filter 1310 to be disposed in the transmitting path of the transceiver 1211 depending on the need of design, and choose one of the second filter 1240 and the third filter 1330 to be disposed in the transmitting path of the transceiver 1212 depending on the needs of design.

As described above, in the invention, the filter is formed in the manner that both ends of the energy storage element are respectively connected with a series resonant circuit and a parallel resonant circuit in cascade. The filter has sufficient attenuation without increasing orders, and may be constituted by the chip inductor and the chip capacitor. Therefore, the filter may effectively reduce the manufacturing cost of the wireless communication device and facilitate minimization of the wireless communication device.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:
1. A filter having an input end and an output end, comprising:
   a first energy storage element, electrically connected between the input end and the output end;
   a first series resonant circuit and a second series resonant circuit, wherein each of the first series resonant circuit and the second series resonant circuit comprises a first capacitor and a first inductor electrically connected in series; and
   a first parallel resonant circuit and a second parallel resonant circuit, wherein each of the first parallel resonant circuit and the second parallel resonant circuit comprises a second capacitor and a second inductor electrically connected in parallel,
   wherein the first series resonant circuit and the first parallel resonant circuit are electrically connected in cascade between a first end of the first energy storage element and a ground, and the second series resonant circuit and the second parallel resonant circuit are electrically connected in cascade between a second end of the first energy storage element and the ground.

2. The filter according to claim 1, wherein the first energy storage element is a third inductor, a first end of the third inductor is electrically connected to the input end and the first capacitor of the first series resonant circuit, and a second end of the third inductor is electrically connected to the output end and the first capacitor of the second series resonant circuit.

3. The filter according to claim 2, wherein the first inductor of the first series resonant circuit is electrically connected to the second capacitor and the second inductor of the first parallel resonant circuit, and the first inductor of the second series resonant circuit is electrically connected to the second capacitor and the second inductor of the second parallel resonant circuit.

4. The filter according to claim 3, wherein the third inductor, the first capacitors and the first inductors of the first and the second series resonant circuits, and the second capacitors and the second inductors of the first and second parallel resonant circuits are chip-type elements.

5. The filter according to claim 1, wherein the first energy storage element is a third capacitor, a first end of the third capacitor is electrically connected to the input end and the first inductor of the first series resonant circuit, and a second end of the third capacitor is electrically connected to the output end and the first inductor of the second series resonant circuit.

6. The filter according to claim 5, wherein the first capacitor of the first series resonant circuit is electrically connected to the second capacitor and the second inductor of the first parallel resonant circuit, and the first capacitor of the second series resonant circuit is electrically connected to the second capacitor and the second inductor of the second parallel resonant circuit.

7. The filter according to claim 6, wherein the third capacitor, the first capacitors and the first inductors of the first and second series resonant circuits, and the second capacitors and the second inductors of the first and second parallel resonant circuits are chip-type elements.

8. The filter according to claim 1, further comprising:
a second energy storage element, having a first end electrically connected to the first energy storage element and a second end electrically connected to the input end or the output end;
a third series resonant circuit; and
a third parallel resonant circuit, wherein the third series resonant circuit and the third parallel resonant circuit are connected in cascade between the second end of the second energy storage element and the ground and configured to increase the order of the filter.

9. The filter according to claim 1, further comprising:
a third series resonant circuit, electrically connected to the input end; and
a fourth series resonant circuit, electrically connected to the output end, wherein the filter filters a signal in a filter band through the third series resonant circuit and the fourth series resonant circuit.

10. The filter according to claim 9, wherein the third series resonant circuit and the fourth series resonant circuit respectively comprise an inductor and a capacitor.

11. A wireless communication device, comprising:
a first transceiver, electrically connected to a first antenna through at least one first signal end;
a second transceiver, electrically connected to a second antenna through at least one second signal end;
a first filter, having a first pass band and a first stop band, and disposed between the at least one first signal end and the first antenna; and
a second filter, having a second pass band and a second stop band, and disposed between the at least one second signal end and the second antenna, wherein the first pass band and the second stop band are identical, and the first stop band and the second pass band are identical, and each of the first filter and the second filter has an input end and an output end and comprises:
a first energy storage element, electrically connected between the input end and the output end;
a first series resonant circuit and a second series resonant circuit, wherein each of the first series resonant circuit and the second series resonant circuit comprises a first capacitor and a first inductor electrically connected in series; and
a first parallel resonant circuit and a second parallel resonant circuit, wherein each of the first parallel resonant circuit and the second parallel resonant circuit comprises a second capacitor and a second inductor electrically connected in parallel, the first series resonant circuit and the first parallel resonant circuit are electrically connected in cascade between a first end of the first energy storage element and a ground, and the second series resonant circuit and the second parallel resonant circuit are electrically connected in cascade between a second end of the first energy storage element and the ground.

12. The wireless communication device according to claim 11, wherein the at least one first signal end comprises a first transmitting end and a first receiving end, and the wireless communication device further comprises:
a first switch, having a first end, a second end, and a third end, the first end of the first switch electrically connected to the first antenna, the second end of the first switch electrically connected to the first receiving end; and
a first power amplifier, wherein the first power amplifier and the first filter are electrically connected in series between the first transmitting end and the third end of the first switch, and the first transceiver conducts the first end of the first switch to the second end or the third end of the first switch.

13. The wireless communication device according to claim 12, further comprising:
a third filter, having a circuit structure identical to that of the first filter, and disposed between the first receiving end and the second end of the first switch.

14. The wireless communication device according to claim 12, wherein the at least one second signal end comprises a second transmitting end and a second receiving end, and the wireless communication device further comprises:
a second switch, having a first end, a second end, and a third end, the first end of the second switch electrically connected to the second antenna, the second end of the second switch electrically connected to the second receiving end; and
a second power amplifier, wherein the second power amplifier and the second filter are electrically connected in series between the second transmitting end and the third end of the second switch, and the second transceiver conducts the first end of the second switch to the second end or the third end of the second switch.

15. The wireless communication device according to claim 14, further comprising:
a third filter, having a circuit structure identical to that of the second filter, and disposed between the second receiving end and the second end of the second switch.

16. The wireless communication device according to claim 11, wherein the first energy storage element of the first filter is a third inductor, a first end of the third inductor is electrically connected to the input end of the first filter and the first capacitor of the first series resonant circuit in the first filter, a second end of the third inductor is electrically connected to the output end of the first filter and the first capacitor of the second series resonant circuit in the first filter.

17. The wireless communication device according to claim 16, wherein the first energy storage element of the second filter is a third capacitor, a first end of the third capacitor is electrically connected to the input end of the second filter and the first inductor of the first series resonant circuit in the second filter, a second end of the third capacitor is electrically connected to the output end of the second filter and the first inductor of the second series resonant circuit in the second filter.

18. The wireless communication device according to claim 17, wherein the third inductor, the third capacitor, the first capacitors and the first inductors of the first filter and the second filter, and the second capacitors and the second inductors of the first filter and the second filter are chip-type elements.

19. The wireless communication device according to claim 11, wherein the first filter and the second filter respectively further comprise:
    a second energy storage element, having a first end electrically connected to the first energy storage element and a second end electrically connected to the output end or the output end;
    a third series resonant circuit, having a circuit structure identical to that of the first series resonant circuit; and
    a third parallel resonant circuit, having a circuit structure identical to that of the first parallel resonant circuit, wherein the third series resonant circuit and the third parallel resonant circuit are connected in cascade between the second end of the second energy storage element and the ground.

20. The wireless communication device according to claim 11, wherein the first filter and the second filter respectively further comprise:
    a third series resonant circuit, electrically connected with the input end; and
    a fourth series resonant circuit, electrically connected with the output end, wherein the third series resonant circuit and the fourth series resonant circuit filter a signal in a filter band.

\* \* \* \* \*